United States Patent [19]

Kumagai et al.

[11] Patent Number: 5,016,071

[45] Date of Patent: May 14, 1991

[54] DYNAMIC MEMORY DEVICE

[75] Inventors: Jumpei Kumagai, Yokohama; Syuso Fujii, Kawasaki, both of Japan

[73] Assignee: Kabushiki Kaisha Toshiba, Kawasaki, Japan

[21] Appl. No.: 403,870

[22] Filed: Sep. 7, 1989

[30] Foreign Application Priority Data

Nov. 18, 1988 [JP] Japan ................................ 63-291958

[51] Int. Cl.⁵ ...................... H01L 29/68; H01L 27/10; H01L 29/06; H01L 23/48
[52] U.S. Cl. ................................... 357/23.6; 357/45; 357/55; 357/68
[58] Field of Search ..................... 357/23.6, 41, 45, 68, 357/23.6 G, 55

[56] References Cited

U.S. PATENT DOCUMENTS 4,748,597  5/1988  Saito et al.
4,860,070  8/1989  Arimoto et al. .................... 357/23.6

FOREIGN PATENT DOCUMENTS 0169346  1/1986  European Pat. Off.
0191612  8/1986  European Pat. Off.
59-124156  12/1982  Japan.
61-274357  5/1985  Japan.
2067010  7/1981  United Kingdom.

OTHER PUBLICATIONS

European Search Report EP 89 11 6870 at The Hague by Examiner P. Vendange on Jan. 15, 1990.
U.S. Patent Application Ser. No. 07/000,463; Entitled: Semiconductor Memory; Filed Jan. 5, 1987.
U.S. Patent Application Ser. No. 07/310,020; Entitled: Semiconductor Memory; Filed Feb. 9, 1989.
U.S. Patent Application Ser. No. 07/117,523; Entitled: Method of Manufacturing Semiconductor Device; Filed Nov. 6, 1987.
U.S. Patent Application Ser. No. 07/096,300; Entitled: Precharge Circuit for Bit Lines of Semiconductor Memory; Filed Aug. 9, 1987.
U.S. Patent Application Ser. No. 07/404,421; Entitled: Semiconductor Memory Device; Filed Aug. 8, 1989.
U.S. Patent Application Ser. No. 07/403,292; Entitled: Cell Capacitor of a Dynamic Random Access Memory and a Method of Manufacturing the Same; Filed Aug. 5, 1989.
U.S. Patent Application Ser. No. 07/216,045; Entitled: Semiconductor Device Having Different Impurity Concentration Wells; Filed Jul. 7, 1988.
U.S. Patent Application Ser. No. 07/416,601; Entitled: Dynamic Memory Device With Improved Wiring Layer Layout; Filed Oct. 3, 1989.

Primary Examiner—William Mintel
Assistant Examiner—R. Potter
Attorney, Agent, or Firm—Finnegan, Henderson, Farabow, Garrett, and Dunner

[57] ABSTRACT

Element regions which are adjacent to each other in a channel width direction are displaced from each other in a channel length direction by ¼ pitch. Cell plate electrodes are formed over the element regions through a capacitor insulation film to extend in an oblique direction. Groove portions formed in a step-form corresponding to the shape of the respective transistor forming regions of the element regions are each formed between corresponding two adjacent ones of the cell plate electrodes. Word lines are formed in a stripe configuration to extend in a channel width direction and used to directly apply potentials to the element regions. Contact holes are formed for contact hole opening preparation regions of the element regions. Bit lines are formed in a stripe configuration to extend in a length width direction and are connected to respective element regions (1) via the contact holes.

12 Claims, 14 Drawing Sheets

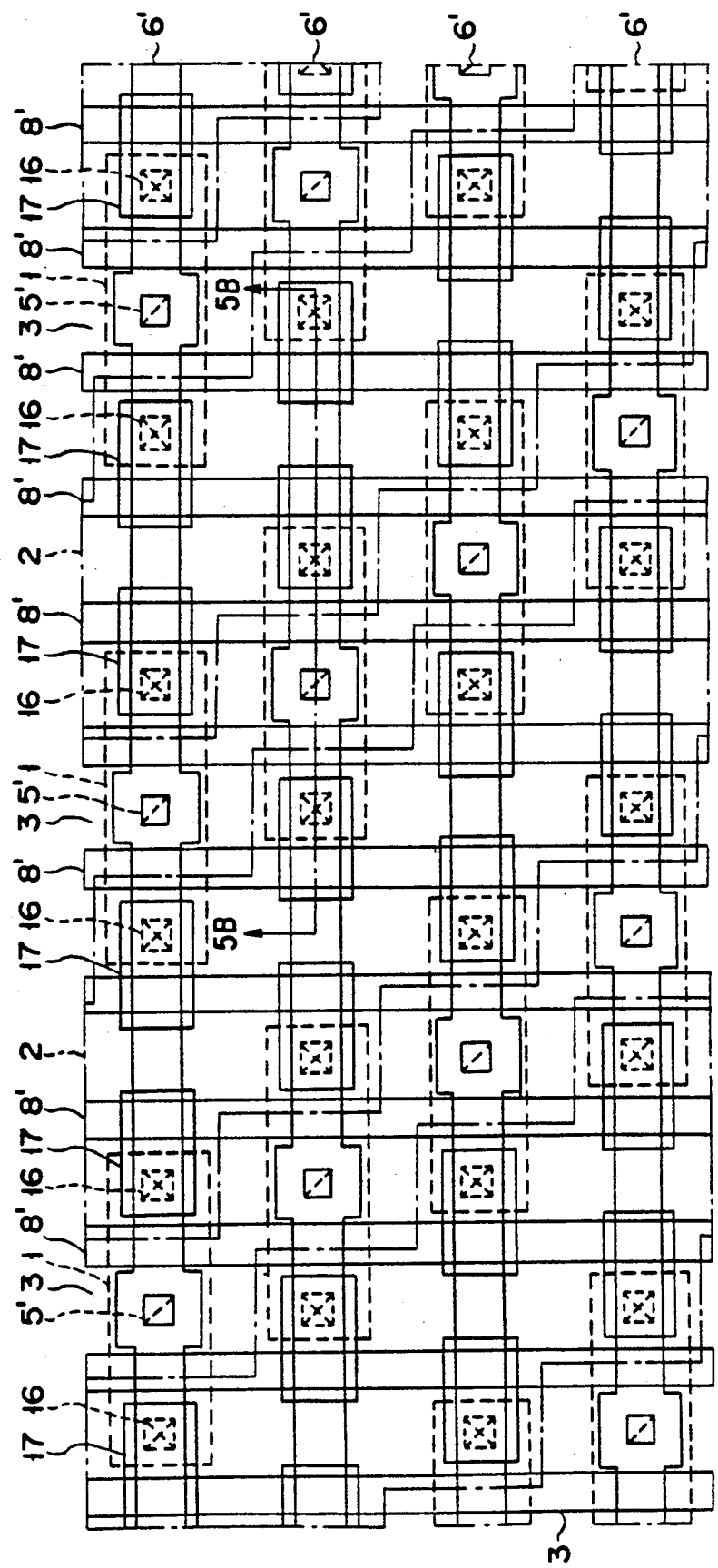
F I G. 5A

DYNAMIC MEMORY DEVICE

BACKGROUND OF THE INVENTION

1. Field of the Invention

This invention relates to a dynamic memory device and a method for manufacturing the same, and more particularly to a dynamic memory device having a plurality of dynamic memory cells which are each constituted by one transistor and one capacitor and which are displaced from one another by $\frac{1}{n}$ (n is a natural number equal to or larger than 2) in a channel length direction and a method for manufacturing the same.

2. Description of the Related Art

A dynamic memory device having a plurality of dynamic memory cells which are each constituted by one transistor and one capacitor and which are displaced from one another by $\frac{1}{n}$ (n is a natural number equal to or larger than 2) in a channel length direction is disclosed in Published Unexamined Japanese Patent Application No. 61-274357, for example. The dynamic memory device disclosed in this specification is explained with reference to FIGS. 6A to 6D. In this case, FIG. 6A is a plan view showing the state in which cell plate electrodes are formed, FIG. 6B is a plan view showing the state in which transfer gates are formed, FIG. 6C is a plan view showing the state in which bit lines connected to the source/drain regions of transistors are formed, and FIG. 6D is a plan view showing the state in which word lines are formed.

In FIG. 6A, a field insulation film (not shown) is formed on the surface of a p-type semiconductor substrate, for example, to form element isolation regions. Element region 1 in which two memory cells are formed is formed in each element isolation region. Each element region 1 includes two capacitor forming regions $1_1$, two transistor forming regions $1_2$ and contact hole forming region $1_3$ for connection with a bit line. Element regions 1 which are adjacent in a channel width direction (in a direction indicated by arrow A in FIG. 6A) are displaced from each other by $\frac{1}{2}$ pitch in a channel length direction (in a direction indicated by arrow B in FIG. 6A). Further, cell plate electrodes 2 are formed over element regions 1 through a capacitor insulation film. Each of cell plate electrodes 2 is arranged to extend in a oblique direction and cover the facing end portions of corresponding adjacent element regions 1. Groove portions 3 which are formed in a stepped configuration in positions corresponding to transistor formation regions $1_2$ of element region 1 are arranged between adjacent cell plate electrodes 2. In each capacitor forming region $1_1$ of each element region 1, an n-type diffusion layer is formed in the p-type substrate, and the n-type diffusion layer, capacitor insulation film, and cell plate electrode 2 are combined to form a capacitor.

Next, as is shown in FIG. 6B, transfer gate electrodes 4 are formed on an insulation film (not shown) by a mask-alignment process. Transfer gate electrodes 4 are formed over contact hole forming regions $4_1$ for connection with the word lines and gate electrode regions $1_4$ which are formed over element regions 1. 1

After this, as is shown in FIG. 6C, contact holes 5 are formed in an insulation film (not shown) in positions corresponding to respective contact hole forming regions $1_3$ of element regions 1 by a mask-alignment process. Then, bit lines 6 are formed in stripe configuration by the mask-alignment process so as to extend in the channel width direction. Bit lines 6 are connected to respective element regions 1 via contact holes 5.

Next, as is shown in FIG. 6D, contact holes 7 are formed in an insulation film (not shown) in positions corresponding to respective contact hole forming regions $4_1$ of transfer gate electrodes 4 by the mask-alignment process. Then, word lines 8 are formed in the stripe configuration to extend in the channel length direction by the mask-alignment process. Word lines 8 and transfer gate electrodes 4 are connected to each other via respective contact holes 7.

With the dynamic memory device of the above construction, the minimum width of cell plate electrode 2 of the capacitor can be made large in comparison with the conventionally well-known dynamic memory in which adjacent memory cells are displaced from each other by $\frac{1}{2}$ pitch in the channel length direction, and therefore cell plate electrode 2 can be easily formed even when the cell size is reduced. For this reason, in order to enhance the integration density, it is advantageous to displace memory cells from each other by $\frac{1}{4}$ pitch in the channel length direction.

However, as is shown in FIG. 6B, the shape of transfer electrode 4 formed over cell plate electrode 2 is complicated and is isolated in the island configuration. Therefore, it is necessary to form a fine gate electrode pattern. Thus, formation of transfer gate electrode 4 becomes difficult though the minimum width of cell plate electrode 2 can be made large and the cell plate electrode can be easily formed. As a result, much improvement of the integration density cannot be expected. Further, formation of contact hole 7 for connecting transfer gate electrode 4 with word line 8 necessitates the alignment tolerance for transfer gate electrode 4, lowering the integration density.

SUMMARY OF THE INVENTION

This invention has been made in view of the above fact, and an object of this invention is to provide a dynamic memory device in which the integration density can be enhanced by removing an obstacle to the improved integration density which is caused because fine and complicated electrode pattern must be formed for the transfer gate electrode and contact regions necessitating the alignment tolerance must be formed for the word lines in the memory cell arrangement in which memory cells are displaced from each other by $\frac{1}{n}$ pitch, and provide a manufacturing method for manufacturing the same in a simplified process.

According to one aspect of this invention, there is provided a dynamic memory device comprising a memory cell array having a plurality of dynamic memory cells each formed of one transistor and one capacitor, adjacent memory cells of the memory array in a direction of the channel width of the transistor being displaced in a channel length direction of the transistor by $\frac{1}{n}$ (n is a natural number not less than 2) pitch, a plurality of gate electrodes formed in a stripe configuration to extend in parallel with each other in the channel width direction and cross the memory cell array, for applying potential to the control terminal of each of the transistors, and a plurality of bit lines formed in a stripe configuration to extend in parallel with each other in the channel length direction and cross the memory cell array.

According to another aspect of this invention, there is provided a dynamic memory device comprising a semiconductor substrate of a first conductivity type, a plurality of element regions formed on the semiconductor substrate, at least one memory cell constituted by one transistor and one capacitor being formed in each of the element regions, each of the element regions including a transistor forming region in which the transistor is to be formed and a capacitor forming region in which the capacitor is to be formed, adjacent ones of the element regions in a channel width direction of the transistor being displaced from each other in a channel length direction of the transistor by $\frac{1}{2}^n$ (n is a natural number not less than 2) pitch, and an accumulation electrode being formed in the capacitor forming region, cell plate electrodes formed on the accumulation electrodes through a first insulation film, the cell plate electrodes being arranged to extend in a oblique direction and cover portions between the capacitor forming regions of a plurality of adjacent element regions which are displaced by $\frac{1}{2}^n$ pitch and each of the cell plate electrode, a corresponding one of the accumulation electrodes and the first insulation film being combined to form a capacitor, a plurality of word lines formed in a stripe configuration over the element regions and the cell plate electrodes through a second insulation film to extend in the channel width direction for applying potentials to the control terminals of the transistors, respectively, and a plurality of bit lines formed in a stripe configuration over the element forming regions, cell plate electrodes and word lines through a third insulation film to extend in the channel length direction and connected to the element regions, respectively.

According to still another aspect of this invention, there is provided a dynamic memory device comprising a semiconductor substrate of a first conductivity type, a plurality of element regions formed on the semiconductor substrate, at least one memory cell constituted by one transistor and one capacitor being formed in each of the element regions, each of the element regions including a transistor forming region in which the transistor is to be formed and a capacitor forming region in which the capacitor is to be formed, adjacent ones of the element regions in a channel width direction of the transistor being displaced from each other in a channel length direction of the transistor by $\frac{1}{2}^n$ (n is a natural number not less than 2) pitch, a plurality of word lines formed in a stripe configuration and formed over the element regions through a first insulation film to extend in the channel width direction, for directly applying potentials to the control terminals of the transistors, respectively, a plurality of accumulation electrodes formed over the element regions and word lines through a second insulation film and connected to the element regions, respectively, cell plate electrodes formed over the element regions, word lines and accumulation electrodes through a third insulation film, the cell plate electrodes being arranged to extend in an oblique direction and cover portions between the capacitor forming regions of a plurality of adjacent element regions which are displaced by $\frac{1}{2}^n$ pitch and each of the cell plate electrodes, a corresponding one of the accumulation electrodes and the third insulation film being combined to form capacitor, and a plurality of bit lines formed in a stripe configuration to extend in the channel length direction and formed over the element regions, cell plate electrodes and word lines through a fourth insulation film and connected to the element regions, respectively.

According to another aspect of this invention, there is provided a method for manufacturing a dynamic memory device comprising the steps of forming a plurality of element regions on a semiconductor substrate of a first conductivity type, at least one memory cell constituted by one transistor and one capacitor being formed in each of the element regions, each of the element regions including a transistor forming region in which the transistor is to be formed and a capacitor forming region in which the capacitor is to be formed, adjacent ones of the element regions in a channel width direction of the transistor being displaced from each other in a channel length direction of the transistor by $\frac{1}{2}^n$ (n is a natural number not less than 2) pitch, and an accumulation electrode being formed in the capacitor forming region, forming cell plate electrodes on the accumulation electrodes through a first insulation film, the cell plate electrodes being arranged to extend in a oblique direction and cover portions between the capacitor forming regions of a plurality of adjacent element regions which are displaced by $\frac{1}{2}^n$ pitch and each of the cell plate electrode, a corresponding one of the accumulation electrodes and the first insulation film being combined to form a capacitor, forming a plurality of word lines in a stripe configuration over the element regions and the cell plate electrodes through a second insulation film to extend in the channel width direction, for applying potentials to the control terminals of the transistors, respectively, forming source/drain diffusion regions in the transistor forming region, and forming a plurality of bit lines in a stripe configuration over the element forming regions, cell plate electrodes and word lines through a third insulation film to extend in the channel length direction and connected to the element regions, respectively.

According to still another aspect of this invention, there is provided a method for manufacturing a dynamic memory device comprising the steps of forming a plurality of element regions on a semiconductor substrate of a first conductivity type, at least one memory cell constituted by one transistor and one capacitor being formed in each of the element regions, each of the element regions including a transistor forming region in which the transistor is to be formed and a capacitor forming region in which the capacitor is to be formed, adjacent ones of the element regions in a channel width direction of the transistor being displaced from each other in a channel length direction of the transistor by $\frac{1}{2}^n$ (n is a natural number not less than 2) pitch, forming a plurality of word lines in a stripe configuration over the element regions through a first insulation film to extend in the channel width direction, for directly applying potentials to the control terminals of the transistors, respectively, forming a plurality of accumulation electrodes over the element regions and word lines through a second insulation film and respectively connected to the element regions, forming cell plate electrodes on the element regions, word lines and accumulation electrodes through a third insulation film, the cell plate electrodes being arranged to extend in a oblique direction and cover portions between the capacitor forming regions of a plurality of adjacent element regions which are displaced by $\frac{1}{2}^n$ pitch and each of the cell plate electrodes, a corresponding one of the accumulation electrodes and the third insulation film being combined to form a capacitor, and forming a plurality of bit lines in a stripe configuration over the element forming regions, cell plate electrodes and word lines through a fourth insulation film to extend in the channel length direction and connected to the element regions, respectively.

BRIEF DESCRIPTION OF THE DRAWINGS

FIG. 5A is a plan view of a dynamic memory device according to a third embodiment of this invention at the time of completion of a step for forming bit lines thereof;

DETAILED DESCRIPTION OF THE PREFERRED EMBODIMENTS

Figure 1A:
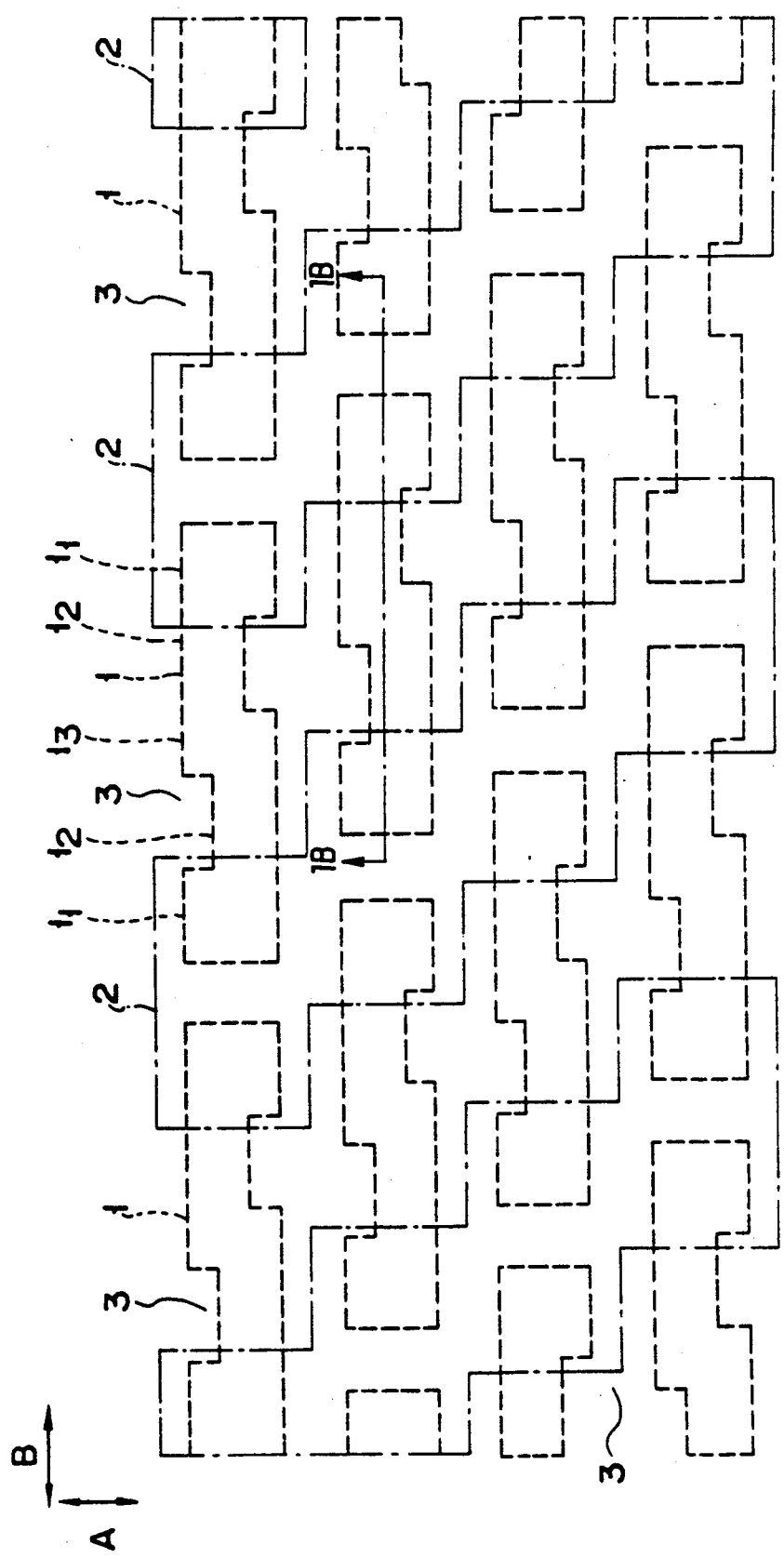
FIG. 1A is a plan view of a dynamic memory device according to one embodiment of this invention at the time of completion of a step for forming cell plate electrodes thereof.

There will now be described a dynamic memory device according to embodiments of this invention in which memory cells are displaced by ¼ pitch in the channel length direction with reference to FIGS. 1A to 5B. In FIGS. 1A to 5B, portions corresponding to those of FIGS. 6A to 6D are denoted by the same reference numerals.

Figure 1B:
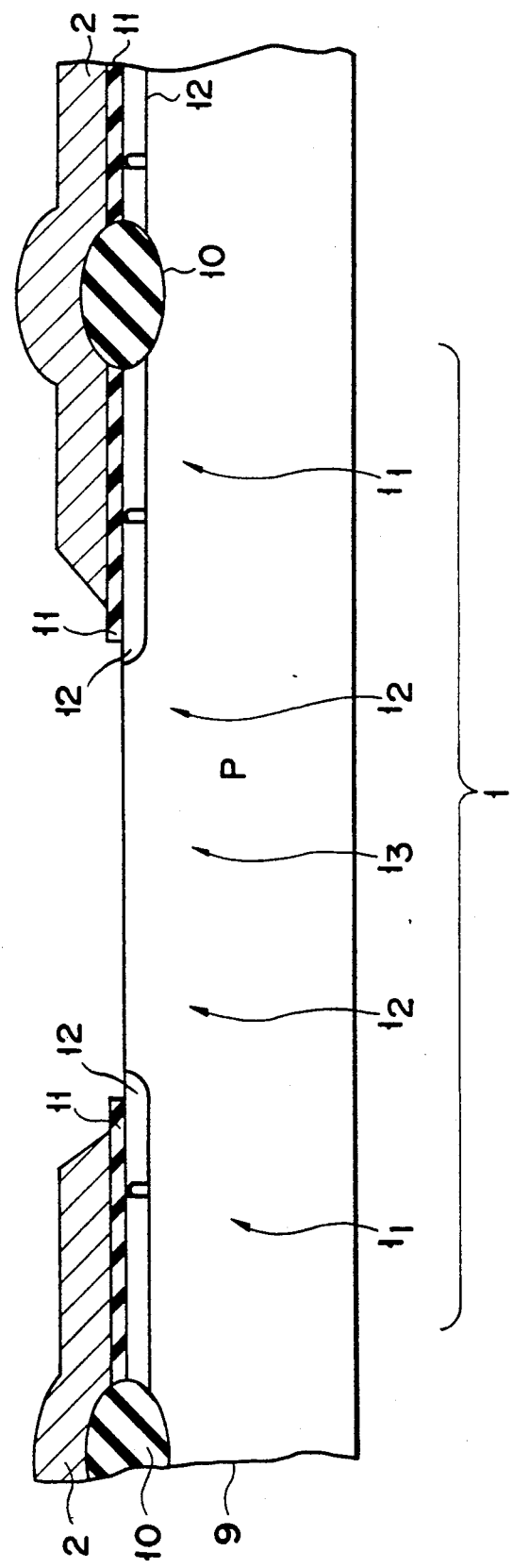
FIG. 1B is a cross sectional view taken along X—X line of FIG. 1A.

As is shown in FIGS. 1A and 1B, field insulation film 10 is formed on the surface of p-type semiconductor substrate 9, for example, to form isolated regions. Element region 1 in which two memory cells are constituted is formed in each of the regions isolated by field insulation film 10. Further, n-type diffusion regions 12 are selectively formed in element region 1. Element region 1 includes two capacitor forming regions $1_1$, two transistor forming regions $1_2$ and contact hole forming region $1_3$. Adjacent element regions 1 in the channel width direction (indicated by arrow A in FIG. 1A) are displaced from each other in the channel length direction (indicated by arrow B in FIG. 1A) by ¼ pitch. Further, cell plate electrodes 2 are formed over element regions 1 through capacitor insulation film 11. Each of cell plate electrodes 2 is arranged to extend in a oblique direction and cover the facing end portions of corresponding adjacent element regions 1. Groove portions 3 which are formed in a stepped configuration in positions corresponding to transistor formation regions $1_2$ of element region 1 are arranged between adjacent cell plate electrodes 2. In capacitor forming region $1_1$ of each element region 1, n-type diffusion layer 12, capacitor insulation film 11, and cell plate electrode 2 are combined to form a capacitor. It is not always necessary to form n-type diffusion layer 12.

Figure 2A:
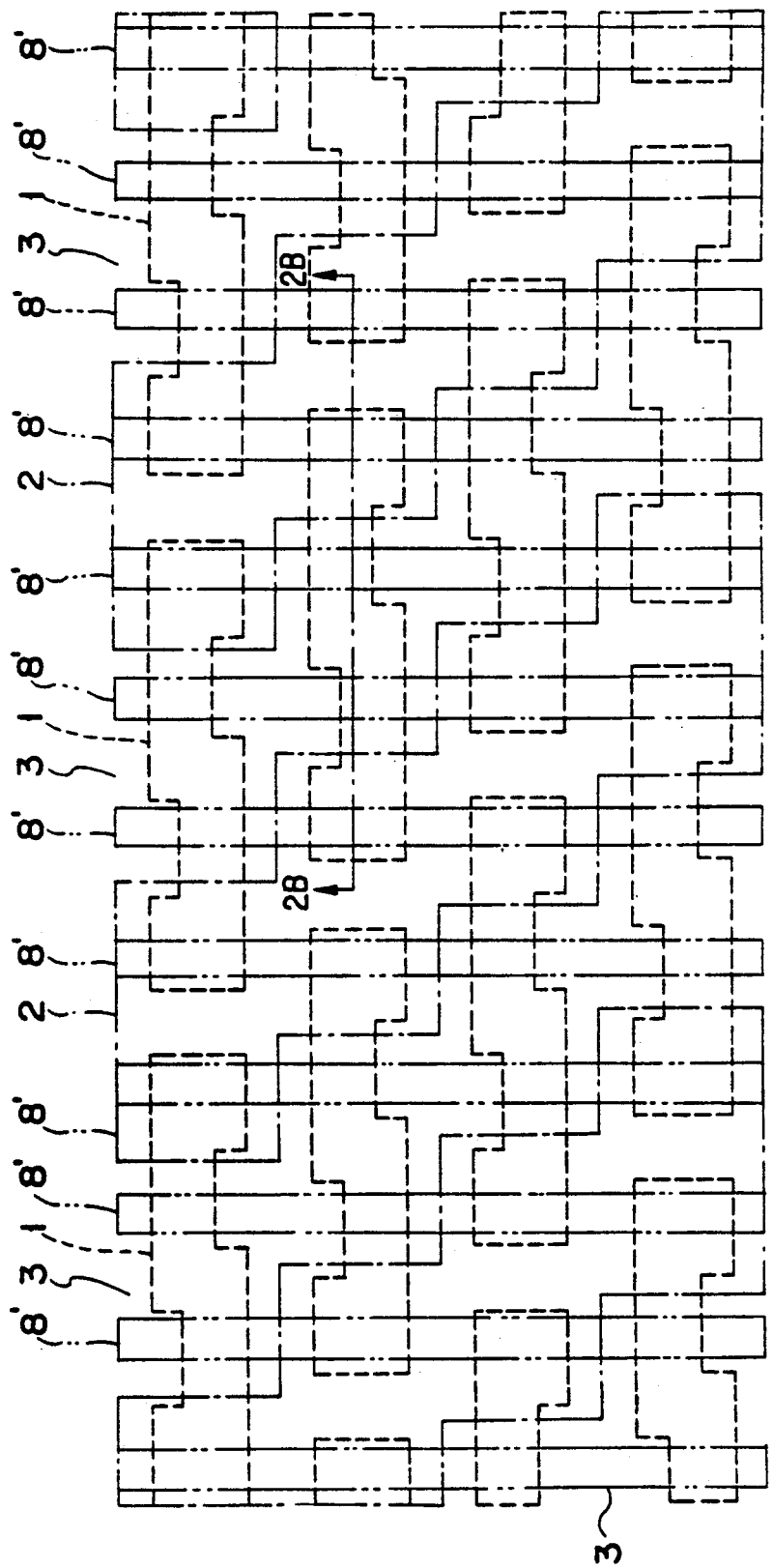
FIG. 2A is a plan view of a dynamic memory device according to one embodiment of this invention at the time of completion of a step for forming word lines thereof.
Figure 2B:
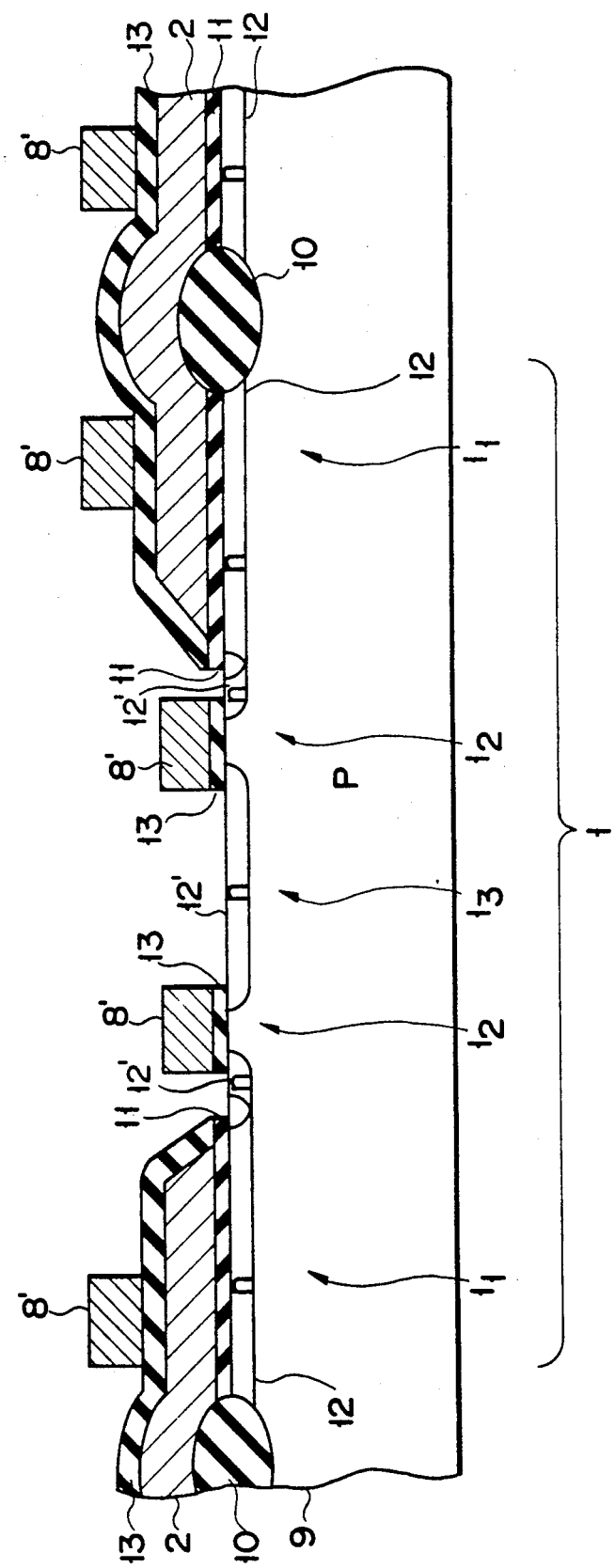
FIG. 2B is a cross sectional view taken along line Y—Y of FIG. 2A.

Next, as is shown in FIGS. 2A and 2B, word lines 8' are formed in a stripe form through insulation film 13 to extend in the channel width direction by a mask-alignment process. Word lines 8' are used as gate electrodes for directly applying potential to element regions 1. In addition, after word lines 8' are formed, ions are injected in the source/drain regions and contact hole forming regions 13 under word lines 8' to form an n-type diffusion layer 12'. Insulation film 13 on substrate 9 and insulation film 13 on cell plate electrode 2 are formed in separate steps, these films are indicated by the same numeral "13" for the sake of convenience.

Figure 3A:
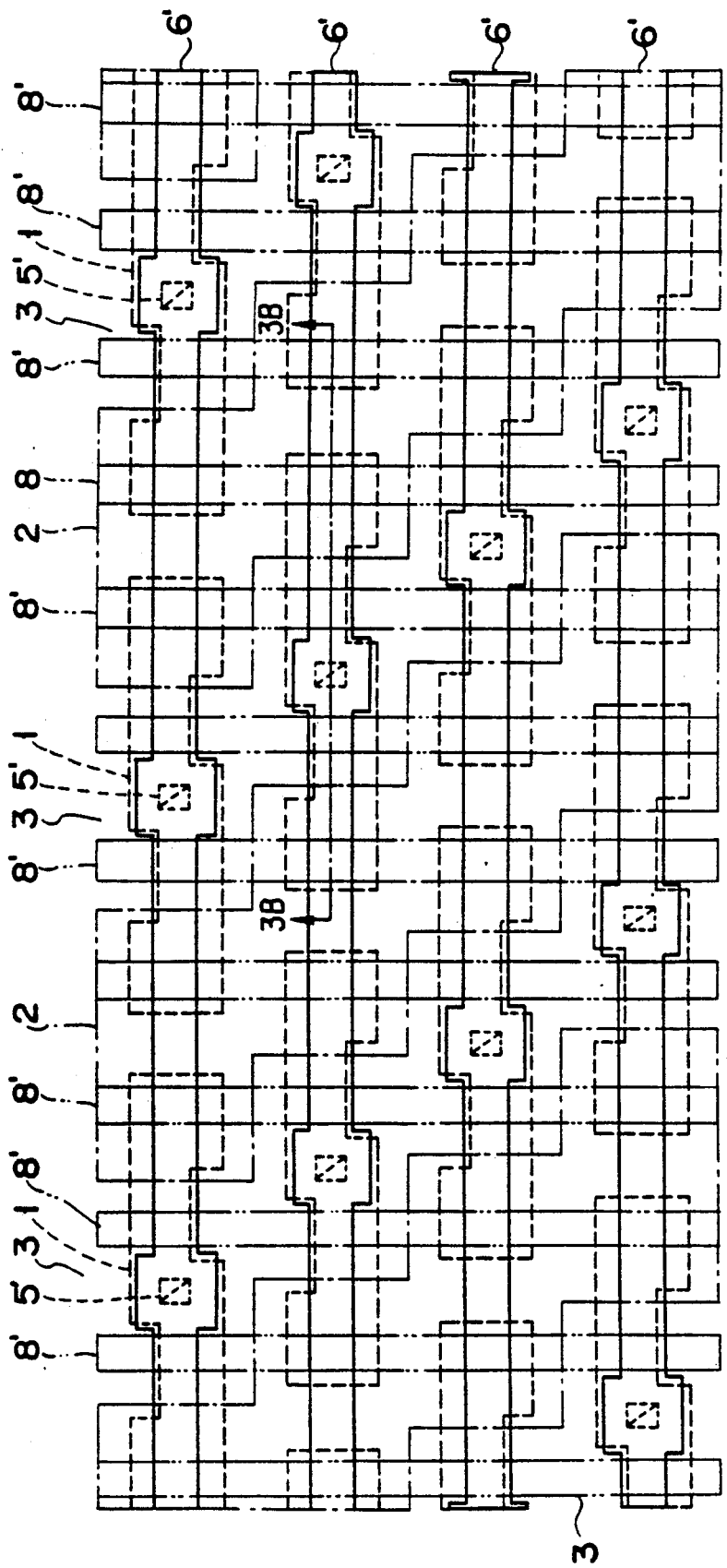
FIG. 3A is a plan view of a dynamic memory device according to a first embodiment of this invention at the time of completion of a step for forming bit lines thereof.
Figure 3B:
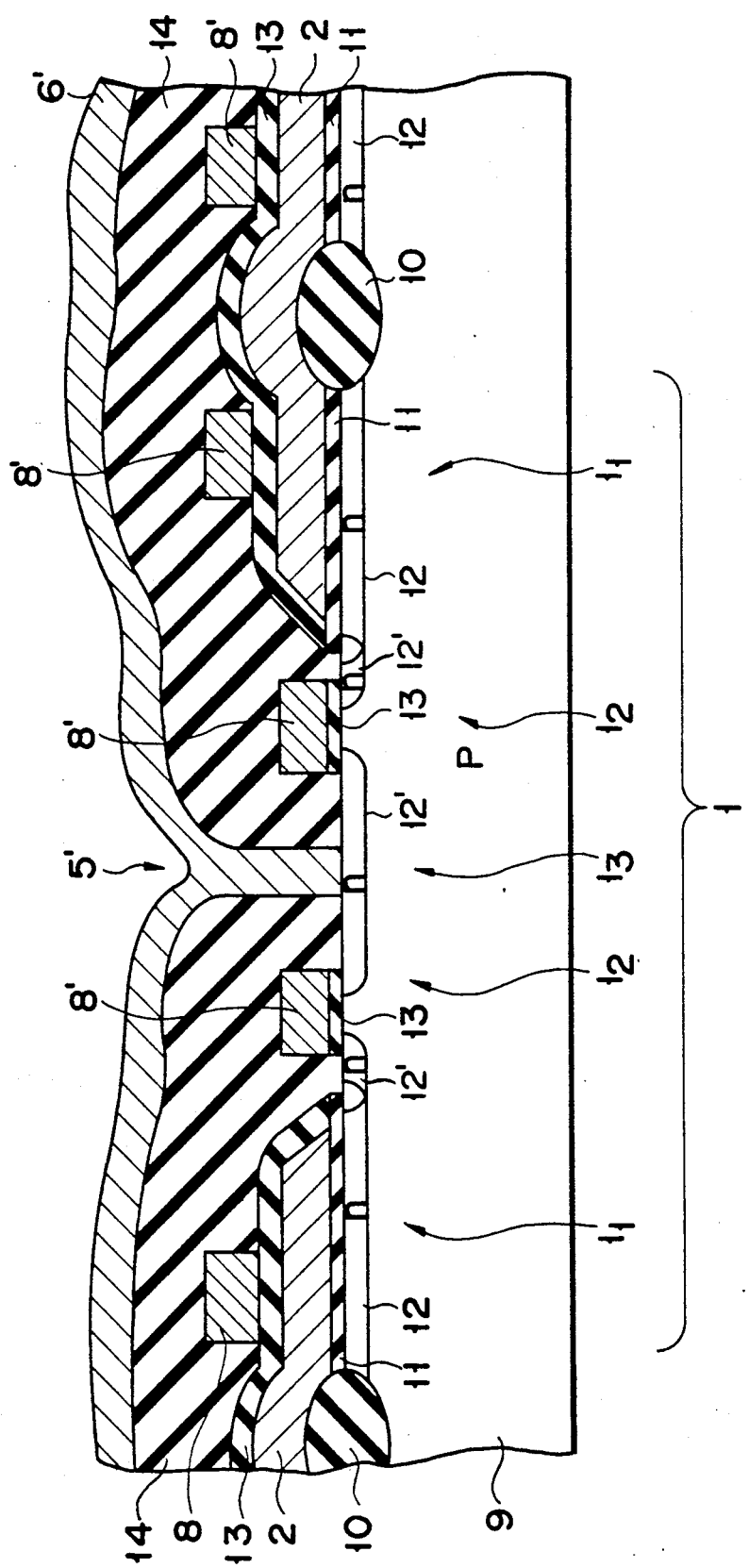
FIG. 3B is a cross sectional view taken along line Z—Z of FIG. 3A.

After this, as is shown in FIGS. 3A and 3B, contact hole 5' is formed in insulation film 14 in position corresponding to contact hole forming region $1_3$ of each element region 1 by the mask-alignment process. Then, bit lines 6' are formed in a stripe form to extend in the channel length direction by the mask-alignment process. Bit lines 6' are connected to element regions 1 are connected to each other via contact holes 5'.

With the dynamic memory device of the above construction, the potential of word line 8' can be directly transmitted to element region 1 without using a transfer gate. That is, since it is only necessary to form word lines 8' of stripe-shape extending in the channel width direction and it is not necessary to form a transfer gate with a complicated and fine pattern, the integration density can be easily enhanced. Further, since no transfer gate is formed, it is not necessary to effect a step for forming contact holes for connection between the transfer gate and word lines 8'. Therefore, it is not necessary to provide a marginal area corresponding to the alignment tolerance for formation of the contact holes. Further, since the number of steps can be reduced, the yield can be enhanced, lowering the manufacturing cost. Since the contact resistance of word line 8' is reduced, the operation speed thereof can be enhanced.

In the first embodiment described above, the cell capacitor of each memory cell is formed with a planar structure including insulation film 11 formed on substrate 9 and plate electrode 2 formed on insulation film 11. Recently, with the miniaturization of devices, memory cells having various types of capacitor structures have been proposed. Of course, such capacitor structures can be effectively used in this invention.

For example, the capacitor structure includes a capacitor structure having an extremely small trench formed in an Si substrate and a capacitor formed in the trench. Now, an embodiment of this invention in which the above capacitor structure is used is explained with reference to FIGS. 4A and 4B. In this embodiment, trench 18 is formed in capacitor forming region $1_1$ of semiconductor substrate 9. N-type diffusion layer 12" is formed in the side and bottom surface areas of trench 18. Further, capacitor insulation film 11 is formed in the front surface area of trench 18 and the front surface area (within capacitor forming region $1_1$) of substrate 9. If cell plate electrode 2 is formed on the semiconductor structure, a cell capacitor is formed with insulation film 11 as the dielectric layer thereof.

The cell structure corresponds to a capacitor obtained by forming a trench in the planar capacitor of the first embodiment to increase the cell capacitor area.

Further, buried stacked capacitor (BSC) cells in which stacked capacitors are buried in respective trenches have been proposed. The cell structure can be effectively used in this invention. That is, in a case where two memory cells are connected to contact hole 5' for bit line 6' and element region 1, this invention can be effectively applied.

Figure 4A:
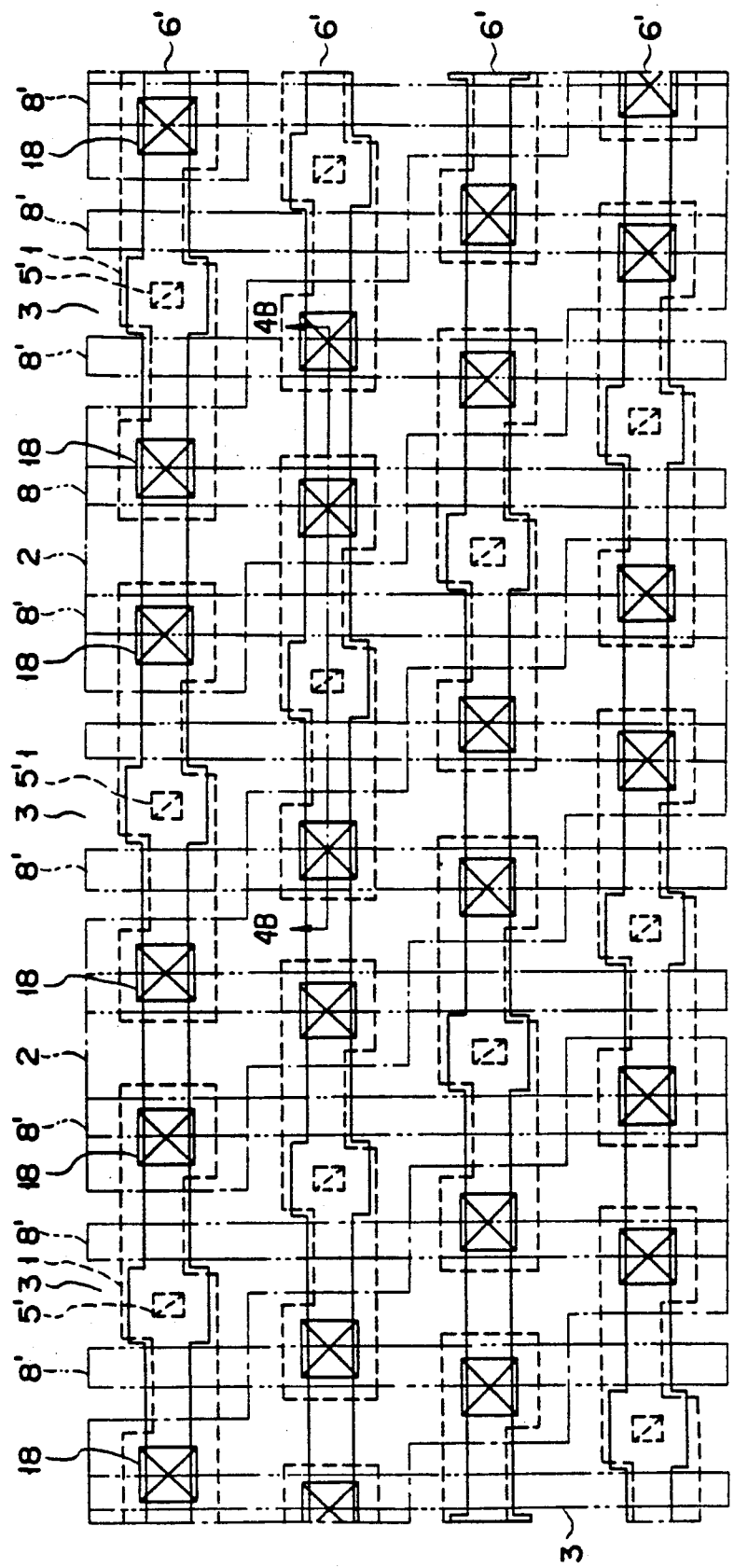
FIG. 4A is a plan view of a dynamic memory device according to a second embodiment of this invention at the time of completion of a step for forming bit lines thereof.
Figure 4B:
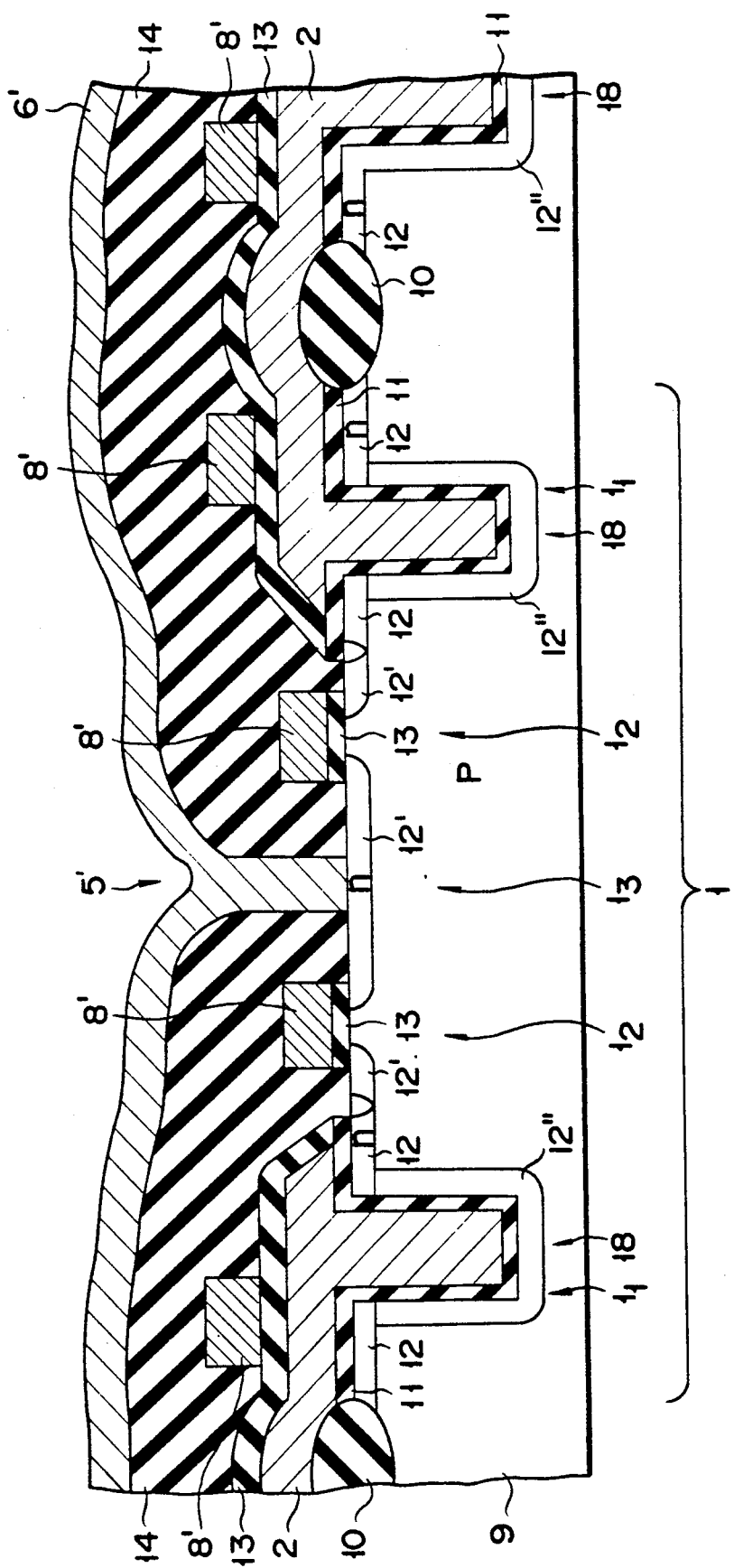
FIG. 4B is a cross sectional view taken along line Z40—Z' of FIG. 4A.

It is not always necessary to form n-type diffusion layer 12". In FIG. 4B, trench 18 is formed inside element region 1. However, trench 18 can be formed so that part thereof may extend through portion of field insulation film 10.

Figure 5B:
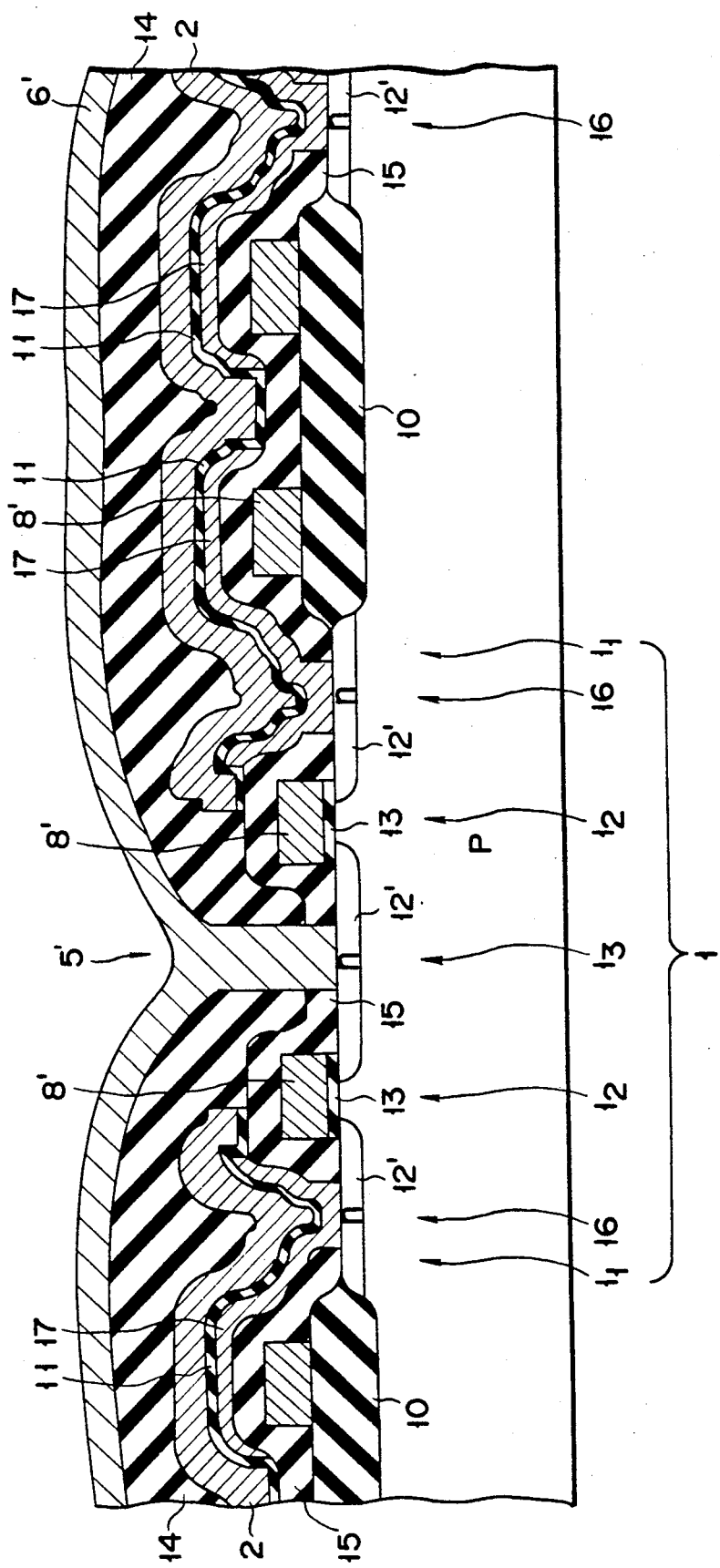
FIG. 5B is a cross sectional view taken along line Z"—Z" of FIG. 5A.
Figure 6A:
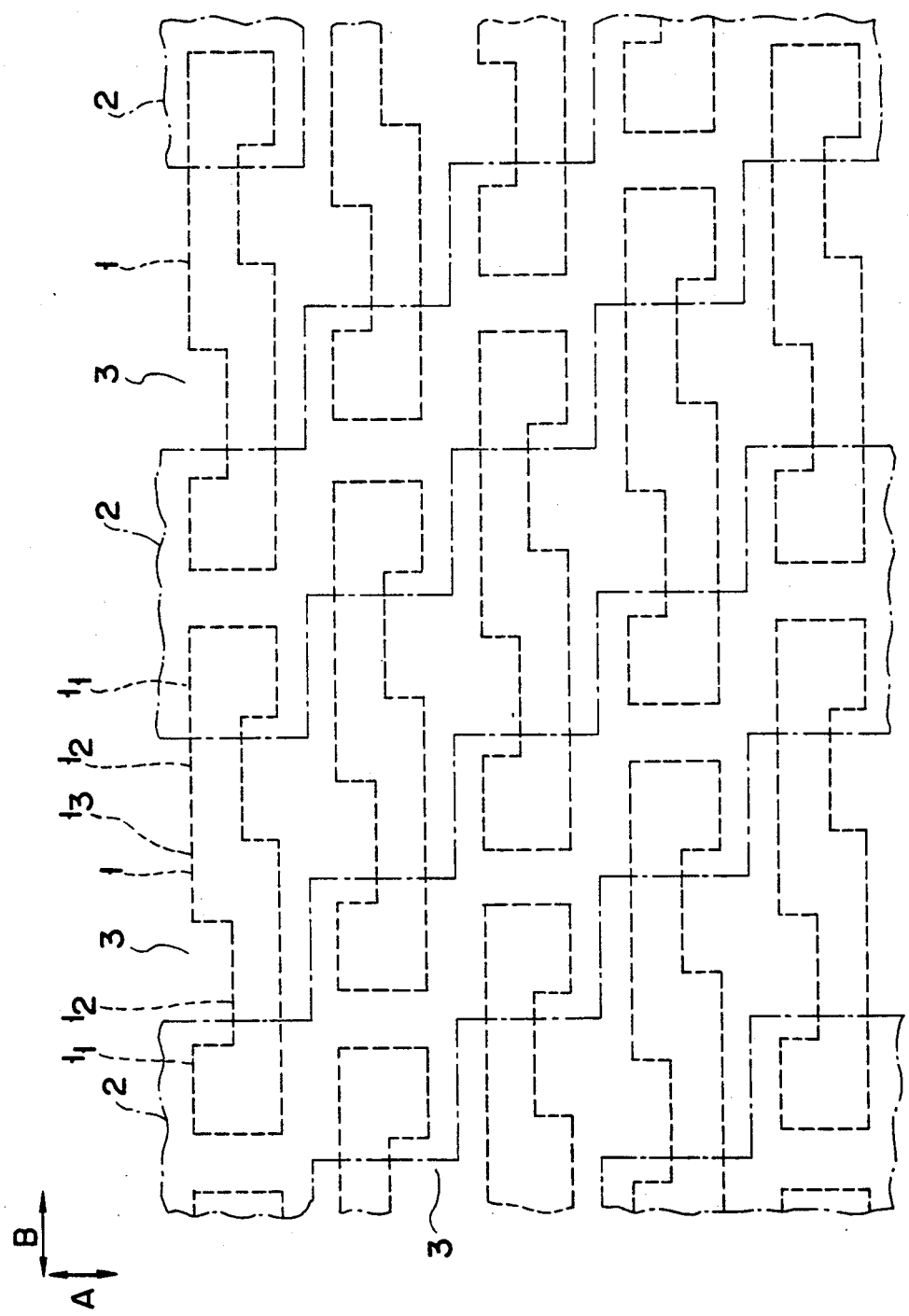
FIGS. 6A to 6D are plan views showing the arrangement of each element of a conventional dynamic memory device in a sequence of the manufacturing steps.
Figure 6B:
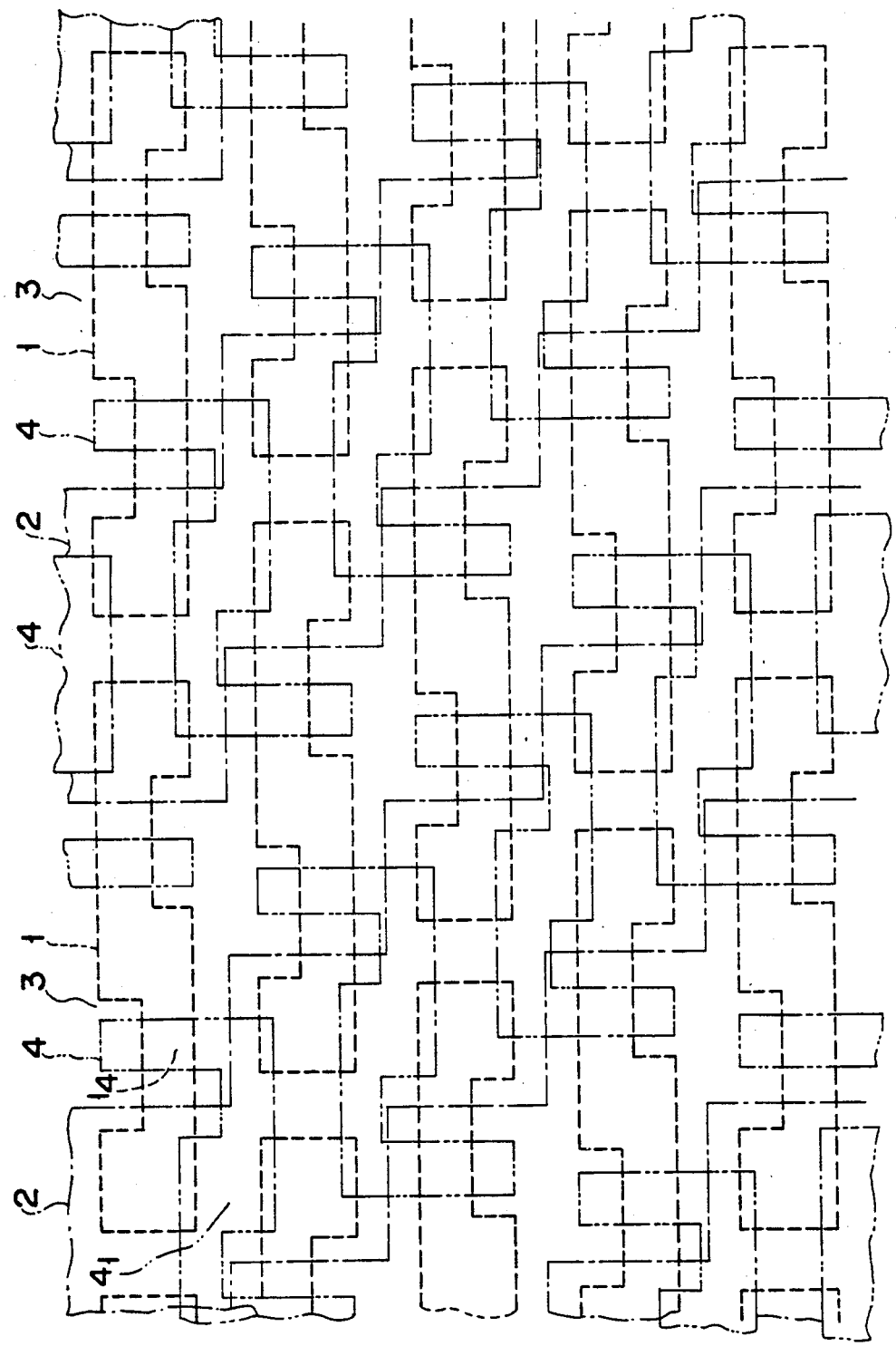
Figure 6C:
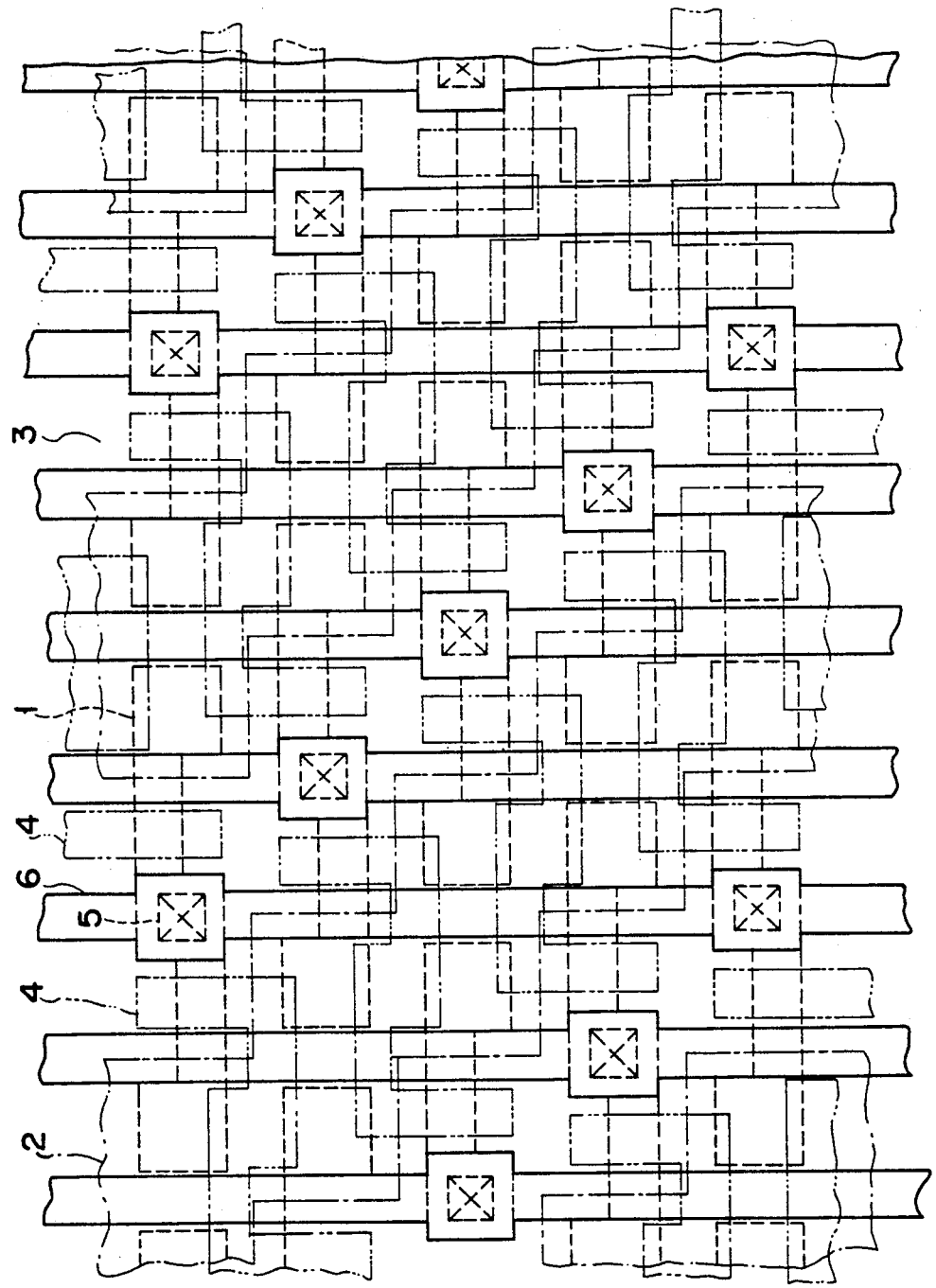
Figure 6D:
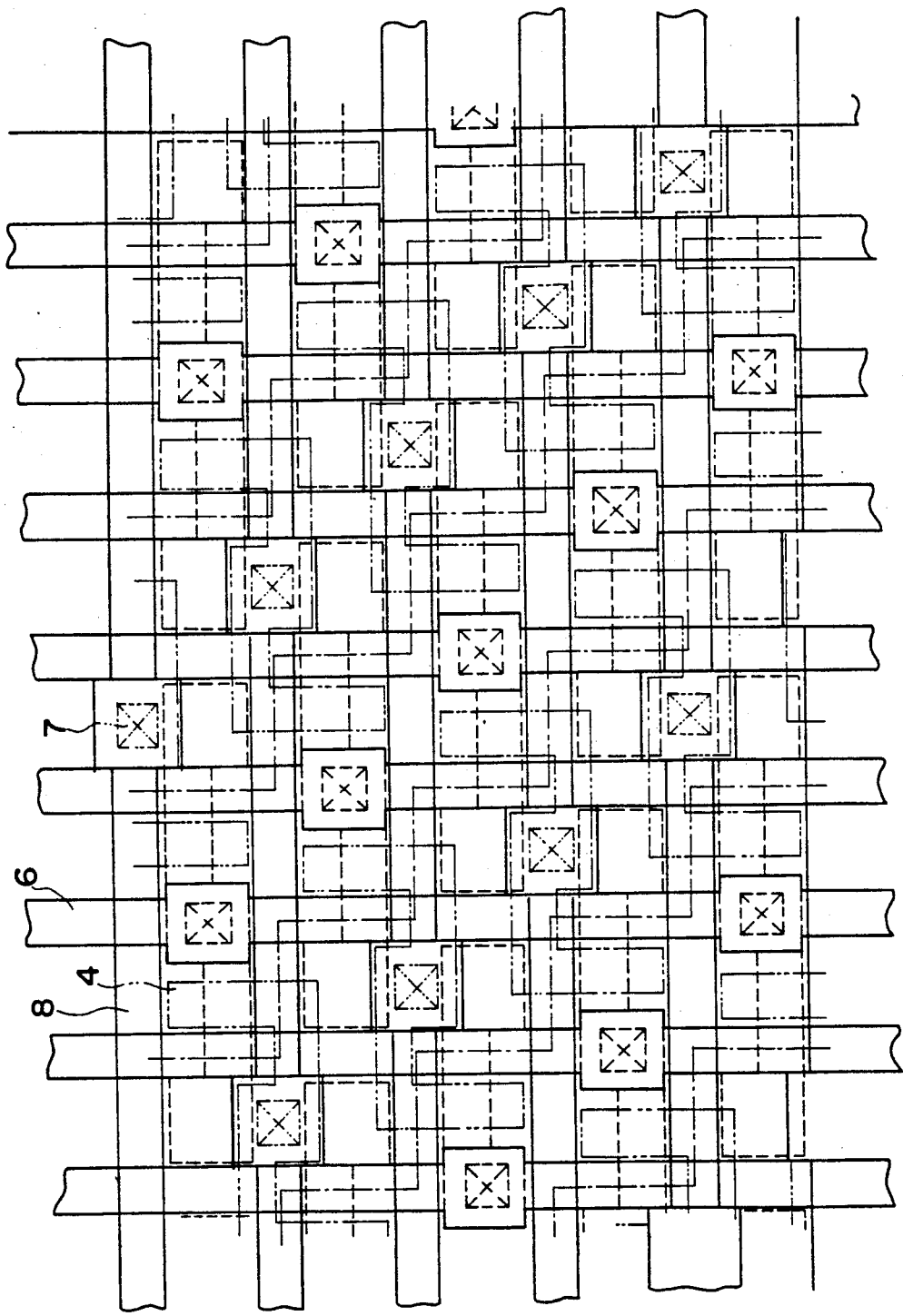

FIGS. 5A and 5B are plan and cross sectional views of a memory cell which is obtained by applying this invention to a memory cell having a stacked capacitor (STC cell structure in which part of the cell capacitor is stacked on word line 8'. Now, a third embodiment of this invention is explained according to the sequence of manufacturing steps with reference to FIGS. 5A and 5B. First, element regions 1 are formed and then cell transistors are formed. That is, after gate insulation films 13 and word lines 8' are formed, n-type impurities are ion-implanted to form n-type diffusion regions 12'. Next, after insulation film 15 is formed on the entire portion of the substrate by deposition, contact holes 16 are formed in capacitor forming regions $1_1$. Further, accumulation electrodes 17 are formed and then insulation films 11 and plate electrodes 2 are formed to constitute cell capacitors. After this, insulation film 14 is formed on the entire portion of the substrate by deposition and then contact holes 5' and bit lines 6' are formed. This invention can be applied to the memory cell of the above structure.

In the first to third embodiments described above, the memory cells are formed on the p-type semiconductor substrate, but can be formed on an n-type semiconductor substrate. It is also possible to form the memory cells on a p-well or n-well which is respectively formed on an n-type substrate of p-type substrate.

As described above, according to this invention, since no transfer gate is formed, the higher integration density and larger scale memory capacity can be attained and the number of steps can be reduced, the yield can be enhanced, thus lowering the cost. Further, since the contact resistance can be reduced, the operation speed can be enhanced. As a result, a dynamic memory device which can be formed at a low cost and high integration density and with a large-scale memory capacity and operated at a high speed can be provided.

In the dynamic memory device of the above embodiment, adjacent memory cells are displaced in the channel length direction by $\frac{1}{4}$ pitch from each other. However, in this invention, the displacement between two adjacent memory cells is not limited to $\frac{1}{4}$ pitch and can be set to $\frac{1}{2^n}$ (n is a natural number equal to or more than 2) pitch.

What is claimed is:
1. A dynamic memory device comprising:
   a memory cell array having a plurality of dynamic memory cells each formed of one transistor and one capacitor, adjacent memory cells of said memory array in a direction of the channel width of said transistor being displaced in a channel length direction of said transistor by $\frac{1}{2^n}$ (n is a natural number not less than 2) pitch;
   a plurality of gate electrodes formed in a stripe configuration to extend in parallel with each other in the channel width direction and cross said memory cell array, for applying potential to the gate electrode of each of said transistors; and
   a plurality of bit lines formed in a stripe configuration to extend in parallel with each other in the channel length direction and cross said memory cell array.

2. The dynamic memory device according to claim 1, wherein the number n is set at 2.

3. The dynamic memory device according to claim 1, wherein said gate electrodes function as word lines.

4. A dynamic memory device comprising:
   a semiconductor substrate of a first conductivity type;
   a plurality of element regions formed on said semiconductor substrate, at least one memory cell constituted by one transistor and one capacitor being formed in each of said element regions, each of the transistors including a gate electrode and each of said element regions including a transistor forming region in which said transistor is to be formed and a capacitor forming region in which said capacitor is to be formed, adjacent ones of said element regions in a channel width direction of said transistor being displaced from each other in a channel length direction of said transistor by $\frac{1}{2^n}$ (n is a natural number not less than 2) pitch, and an accumulation electrode being formed in said capacitor forming region;
   cell plate electrodes formed on said accumulation electrodes through a first insulation film, said cell plate electrodes being arranged to extend in a oblique direction and cover portions between the capacitor forming regions of a plurality of adjacent element regions which are displaced by $\frac{1}{2^n}$ pitch and each of said cell plate electrodes, a corresponding one of said accumulation electrodes and said first insulation film being combined to form a capacitor;
   a plurality of word lines formed in a stripe configuration and formed over said element regions and said cell plate electrodes through a second insulation film to extend in the channel width direction, for applying potentials to the gate electrodes of said transistors, respectively; and
   a plurality of bit lines formed in a stripe configuration and formed over said element regions, cell plate electrodes and word lines through a third insulation film to extend in the channel length direction and connected to said element regions, respectively.

5. The dynamic memory device according to claim 4, wherein the number n is set at 2.

6. The dynamic memory device according to claim 4, wherein two memory cells each constituted by a transistor and a capacitor are formed in each of said element regions and each of said element regions includes two transistor forming regions in each of which said transistor is formed and two capacitor forming regions in each of which said capacitor is formed.

7. The dynamic memory device according to claim 4, further comprising contact holes formed in said third insulation film in positions corresponding to preset regions of said element regions, said bit lines being connected to said element regions via said contact holes, respectively.

8. The dynamic memory device according to claim 4, wherein said accumulation electrode is at least partly buried in one of a small hole and trench formed in said semiconductor substrate.

9. A dynamic memory device comprising:

a semiconductor substrate of a first conductivity type;

a plurality of element regions formed on said semiconductor substrate, at least one memory cell constituted by one transistor and one capacitor being formed in each of said element regions, each of the transistors including a gate electrode and each of said element regions including a transistor forming region in which said transistor is to be formed and a capacitor forming region in which said capacitor is to be formed, adjacent ones of said element regions in a channel width direction of said transistor being displaced from each other in a channel length direction of said transistor by $\frac{1}{2}^n$ (n is a natural number not less than 2) pitch;

a plurality of word lines formed in a stripe configuration and formed over said element regions through a first insulation film to extend in the channel width direction, for directly applying potentials to the gate electrodes of said transistors, respectively;

a plurality of accumulation electrodes formed over said element regions and word lines through a second insulation film and connected to said element regions, respectively;

cell plate electrodes formed over said element regions, word lines and accumulation electrodes through a third insulation film, said cell plate electrodes being arranged to extend in a oblique direction and cover portions between the capacitor forming regions of a plurality of adjacent element regions which are displaced by $\frac{1}{2}^n$ pitch and each of said cell plate electrodes, a corresponding one of said accumulation electrodes and said third insulation film being combined to form a capacitor; and a plurality of bit lines formed in a stripe configuration to extend in the channel length direction and formed over said element regions, cell plate electrodes and word lines through a fourth insulation film and connected to said element regions, respectively.

10. The dynamic memory device according to claim 9, wherein the number n is set at 2.

11. The dynamic memory device according to claim 9, wherein two memory cells each constituted by a transistor and a capacitor are formed in each of said element regions and each of said element regions includes two transistor forming regions in each of which said transistor is formed and two capacitor forming regions in each of which said capacitor is formed.

12. The dynamic memory device according to claim 9 further comprising contact holes formed in said fourth insulation film in positions corresponding to preset regions of said element regions, said bit lines being connected to said element regions via said contact holes, respectively.

* * * * *